United States Patent
Jin et al.

(10) Patent No.: US 12,359,792 B2
(45) Date of Patent: Jul. 15, 2025

(54) DISPLAY BACKLIGHT HAVING LEDS WITH TRANSPARENT FRAME

(71) Applicant: Shenzhen Jufei Optoelectronics Co., Ltd., Shenzhen (CN)

(72) Inventors: Zhonghua Jin, Shenzhen (CN); Lianjian Deng, Shenzhen (CN); Zhicai Guo, Shenzhen (CN); Longjie Xiong, Shenzhen (CN)

(73) Assignee: Shenzhen Jufei Optoelectronics Co., Ltd., Shenzhen (CN)

( * ) Notice: Subject to any disclaimer, the term of this patent is extended or adjusted under 35 U.S.C. 154(b) by 0 days.

(21) Appl. No.: 18/644,485

(22) Filed: Apr. 24, 2024

(65) Prior Publication Data

US 2024/0271773 A1   Aug. 15, 2024

Related U.S. Application Data

(63) Continuation of application No. 17/787,658, filed as application No. PCT/CN2020/139835 on Dec. 28, 2020, now Pat. No. 11,994,283.

(30) Foreign Application Priority Data

Dec. 25, 2019   (CN) .......................... 201922369251.8

(51) Int. Cl.
*F21V 5/00*      (2018.01)
*H01L 33/44*    (2010.01)
(Continued)

(52) U.S. Cl.
CPC ........... *F21V 5/007* (2013.01); *F21Y 2105/00* (2013.01); *F21Y 2115/10* (2016.08)

(58) Field of Classification Search
CPC ......... H01L 33/44; H01L 33/46; H01L 33/48; H01L 33/42; G02F 1/133603;
(Continued)

(56) References Cited

U.S. PATENT DOCUMENTS 6,653,661 B2 * 11/2003 Okazaki .................. H01L 24/97
257/E33.059
7,378,686 B2 * 5/2008 Beeson .................... H01L 33/58
362/621
(Continued)

FOREIGN PATENT DOCUMENTS

CN      101872827 A    10/2010
CN      102224448 A    10/2011
(Continued)

*Primary Examiner* — Ismael Negron
(74) *Attorney, Agent, or Firm* — Birch, Stewart, Kolasch & Birch, LLP

(57) ABSTRACT

An LED device includes at least two lead electrodes disposed opposite to each other, a transparent molding, a light-emitting element, a resin layer, and a light-blocking layer. The transparent molding is positioned between the lead electrodes and around edges of the lead electrodes to form a recess, the light-emitting element disposed in the recess. The resin layer is formed in the recess of the transparent molding and covering the light-emitting element. The light-blocking layer is disposed on the resin layer, with its upper surface coplanar with an upper surface of the transparent molding. An LED backlight module includes a diffusion plate, a brightening film, a microlens-prism film, a quantum dot film, a plurality of LED devices in a substrate, and a driving circuit. The plurality of LED devices forms a plurality of groups arranged in an N*N array, such that LED devices of adjacent rows are misaligned with each other.

9 Claims, 13 Drawing Sheets

(51) Int. Cl.
*F21Y 105/00* (2016.01)
*F21Y 115/10* (2016.01)

(58) Field of Classification Search
CPC ......... G02F 1/133606; G02F 1/133611; G02F 1/133607; F21V 5/007
USPC ...................... 257/98, 99, 100; 313/498, 512
See application file for complete search history.

(56) References Cited

U.S. PATENT DOCUMENTS

| | | | |
|---|---|---|---|
| 7,510,889 B2 | 3/2009 | Pan et al. | |
| 7,582,915 B2 * | 9/2009 | Hsing Chen | G02B 19/0071 |
| | | | 257/E33.072 |
| 8,368,099 B2 | 2/2013 | Lu et al. | |
| 8,757,826 B2 | 6/2014 | Sakai et al. | |
| 8,835,951 B2 * | 9/2014 | Ichikawa | H01L 33/505 |
| | | | 257/98 |
| 9,406,655 B2 | 8/2016 | Yong | |
| 10,948,163 B2 | 3/2021 | Lee | |
| 11,428,985 B2 | 8/2022 | Park et al. | |
| 11,994,283 B2 * | 5/2024 | Jin | H01L 33/58 |
| 2005/0141242 A1 | 6/2005 | Takeuchi | |
| 2006/0164003 A1 | 7/2006 | Chan et al. | |
| 2011/0291114 A1 | 12/2011 | Cheng | |

FOREIGN PATENT DOCUMENTS

| | | | | |
|---|---|---|---|---|
| CN | 104037169 A | | 9/2014 | |
| CN | 104818024 A | | 8/2015 | |
| CN | 208208788 U | | 12/2018 | |
| CN | 109628022 A | | 4/2019 | |
| CN | 211237579 U | | 8/2020 | |
| CN | 211858676 U | * | 11/2020 | ............ H01L 33/18 |
| CN | 211980635 U | * | 11/2020 | ............ H01L 33/18 |
| CN | 211980636 U | | 11/2020 | |
| CN | 114509897 A | | 5/2022 | |
| DE | 102012102114 A1 | * | 9/2013 | ........... G02B 6/0068 |
| EP | 3330604 A1 | * | 6/2018 | ........... G02B 6/0023 |
| JP | 2014-130871 A | | 7/2014 | |
| JP | 2010523007 A | * | 7/2017 | ............ H01L 33/00 |
| JP | 2021-518971 A | | 8/2021 | |

\* cited by examiner

DISPLAY BACKLIGHT HAVING LEDS WITH TRANSPARENT FRAME

CROSS-REFERENCE TO RELATED APPLICATIONS

This application is a continuation of application Ser. No. 17/787,658, filed Jun. 21, 2022, which is a National Stage Entry of PCT/CN2020/139835. The prior applications are herewith incorporated by reference in its entirety.

TECHNICAL FIELD

The present disclosure relates to fields of backlight modules, and more particularly to a light-emitting device and an LED backlight module.

RELATED ART

The backlight module is one of key components of the display device, and the backlight module is provided as the backlight source of the display device for emission. The manufacturing of a direct-type backlight module known to the inventor is simple and does not need the light-guiding plate. As shown in FIG. 1-1 and FIG. 1-2, the light distribution curve of the LED of the backlight module known to the inventor is a unimodal curve, that is, the curve has one peak at the center. As a result, the center portion of the LED is brighter, while the peripheral portion of the LED is darker. Consequently, more LEDs or films are provided for improving the optical performance of the backlight module. For example, as shown in FIG. 2, in the direct-type backlight module, the LED array and the PCB are disposed on the bottom portion. After the light is emitted from the LED, the light passes through the diffusion plate, a multilayer brightening film, and a DBEF ("dual brightness enhancement film" or "reflective-type polarizing film"), and then the light is emitted out of the backlight module. Under such configuration, the backlight module can achieve the optical performance in which the brightness requirement is satisfied. Because the backlight module known to the inventor improves its optical performance through increased unimodal-curve LEDs or films, the cost for the backlight module is increased and the backlight module also fails to achieve the needs of thin and light weighted as well as low energy consumption.

SUMMARY

According to one or some embodiments of the present disclosure, one of the issues to be solved is: the LED device utilized in the backlight module cannot achieve wide-angle and uniform illumination, and the cost for the backlight module known to the inventor is larger as well as the backlight module fails to achieve the needs of thin and light as well as low energy consumption.

In view of this, one of some embodiments of the present disclosure provides a light-emitting device comprising at least two lead electrodes, a transparent molding, a light-emitting element, a resin layer, and a light-blocking layer. The lead electrodes are disposed opposite to each other. The transparent molding is positioned between the lead electrodes and around edges of the lead electrodes to form a recess. The light-emitting element is disposed in the recess of the transparent molding. The resin layer is formed in the recess of the transparent molding and covering the light-emitting element. The light-blocking layer is disposed on the resin layer, and an upper surface of the light-blocking layer is coplanar with an upper surface of the transparent molding.

Optionally, according to one or some embodiments of the present disclosure, the light-blocking layer covers 60%-95% of an area of an upper surface of the resin layer.

Optically, according to one or some embodiments of the present disclosure, a material of the transparent molding is selected from transparent resin, transparent thermoplastic plastic material, PPA (polyphthalamide), or EMC (epoxy molding compound).

Optionally, according to one or some embodiments of the present disclosure, the resin layer includes a fluorescent material to absorb a first light emitted by the light-emitting element and then emit a second light.

Optionally, according to one or some embodiments of the present disclosure, a light emitted by the light-emitting element is transmitted through a side wall of the transparent molding.

Optionally, according to one or some embodiments of the present disclosure, a surface of the resin layer away from the lead electrodes is a concave surface.

Optionally, according to one or some embodiments of the present disclosure, the resin layer includes a diffusion agent, and an amount of the diffusion agent over the resin layer is 1%-10% weight percentage.

Optionally, according to one or some embodiments of the present disclosure, the light-blocking layer includes a transparent resin and a white particle, and a material of the white particle is selected from silicon dioxide, titanium dioxide, calcium carbonate, boron nitride, or their mixture. Furthermore, according to one or some embodiments of the present disclosure, a weight percentage of the white particle over the light-blocking layer is 10%-50%.

Optionally, according to one or some embodiments of the present disclosure, an upper surface of the resin layer is a concave surface, and a height of the concave surface of the resin layer is same as a height of the light-blocking layer.

Optionally, according to one or some embodiments of the present disclosure, a surface of the light-blocking layer exposed to ambient air is a convex surface.

According to an embodiment of the present disclosure, an LED backlight module is also provided and comprises a diffusion plate, a brightening film, a microlens-prism composite film (MOP), a quantum dot optical film (QBEF), a driving circuit, a substrate, and a plurality of LED devices. The plurality of LED devices is on the substrate. Each of the plurality of LED devices comprises a transparent LED frame, a light-emitting element disposed on a bottom portion of the transparent LED frame, and a resin layer formed inside the transparent LED frame and covering the light-emitting element. The diffusion plate, the brightening film, the microlens-prism composite film (MOP), and the quantum dot optical film (QBEF) are sequentially arranged over the plurality of LED devices. The plurality of LED devices is divided into a plurality of groups arranged in an N*N parallelogram array, and the LED devices of adjacent two rows in each of the groups arranged in the N*N parallelogram array are misaligned with each other.

Optionally, according to one or some embodiments of the present disclosure, every four LED devices of the plurality of LED devices form a group arranged in a 2*2 parallelogram, the plurality of groups arranged in the 2*2 parallelogram is arranged in an array, and the LED devices of adjacent two rows in the array are misaligned with each other.

Optionally, according to one or some embodiments of the present disclosure, the adjacent two rows or two columns of the groups arranged in the 2*2 parallelogram are misaligned with each other.

Optionally, according to one or some embodiments of the present disclosure, the LED frame includes a metal substrate and a wall, and a material of the wall is selected from transparent resin, transparent thermoplastic plastic material, PPA (polyphthalamide) or EMC (epoxy molding compound). Furthermore, according to one or some embodiments of the present disclosure, the resin layer includes a fluorescent material to absorb a first light emitted by the light-emitting element and then emit a second light. Furthermore, according to one or some embodiments of the present disclosure, a light emitted by the light-emitting element is transmitted through the wall of the LED frame.

Optionally, according to one or some embodiments of the present disclosure, each of the light-emitting devices comprises at least two lead electrodes, and a surface of the resin layer away from the lead electrodes of each of the light-emitting devices is a concave surface.

Optionally, according to one or some embodiments of the present disclosure, the resin layer includes a diffusion agent, and the amount of the diffusion agent over the resin layer is 1%-10% weight percentage.

Optionally, according to one or some embodiments of the present disclosure, the plurality of LED devices includes a light-blocking layer disposed on the resin layer, each of the light-emitting devices comprises a transparent molding, and an upper surface of the light-blocking layer is coplanar with an upper surface of the transparent molding and covers 60%-95% of an area of an upper surface of the resin layer.

The beneficial effect of the instant disclosure is described as following.

In the LED device according to one or some embodiments of the present disclosure, through the application of the transparent LED frame, the light emitted from the LED chip can be emitted through the transparent LED frame, thereby allowing the LED device to perform wide-angle illumination. Furthermore, the diffusion agent is distributed in the packaging glue layer. Therefore, the light emitted from the LED chip can be refracted by the diffusion agent and the packaging glue layer, so that the light emitted from the LED device can perform uniform illumination. Moreover, as compared to the LED device known to the inventor which perform the unimodal curve, the LED device with the wide-angle and uniform illumination features can provide a bimodal curve.

Moreover, according to the LED device of one or some embodiments of the present disclosure, the OD value of the backlight module can be reduced, while the PITCH value between the LED devices of the backlight module can be increased, so that the number of the LED devices in the backlight module can be reduced to reduce the cost of the backlight module. Furthermore, as compared to the films adopted in the backlight module known to the inventor, in the LED backlight module of one or some embodiments of the present disclosure, the optical film comprises a brightening film, an MOP, and a QBEF. Hence, by reducing the number or the type of the films, proper optical performances of the LED backlight module can still be ensured. Moreover, under such configuration, the cost of the backlight module can be reduced, and the backlight module with a thin and light weighted configuration can be achieved.

BRIEF DESCRIPTION OF THE DRAWINGS

The present invention will become more readily apparent to those ordinarily skilled in the art after reviewing the following detailed description and accompanying drawings, in which:

FIG. 1-2 illustrates a schematic simulation view of an LED device known to the inventor;

FIG. 2 illustrates a schematic structural view of a backlight module known to the inventor;

DETAILED DESCRIPTION

In order to make the object, technical solutions, and advantages of the present disclosure more clearly understood, the following embodiments of the present disclosure are described in further detail by ways of specific embodiments in conjunction with the accompanying drawings.

Embodiment (1)

Figure 1:
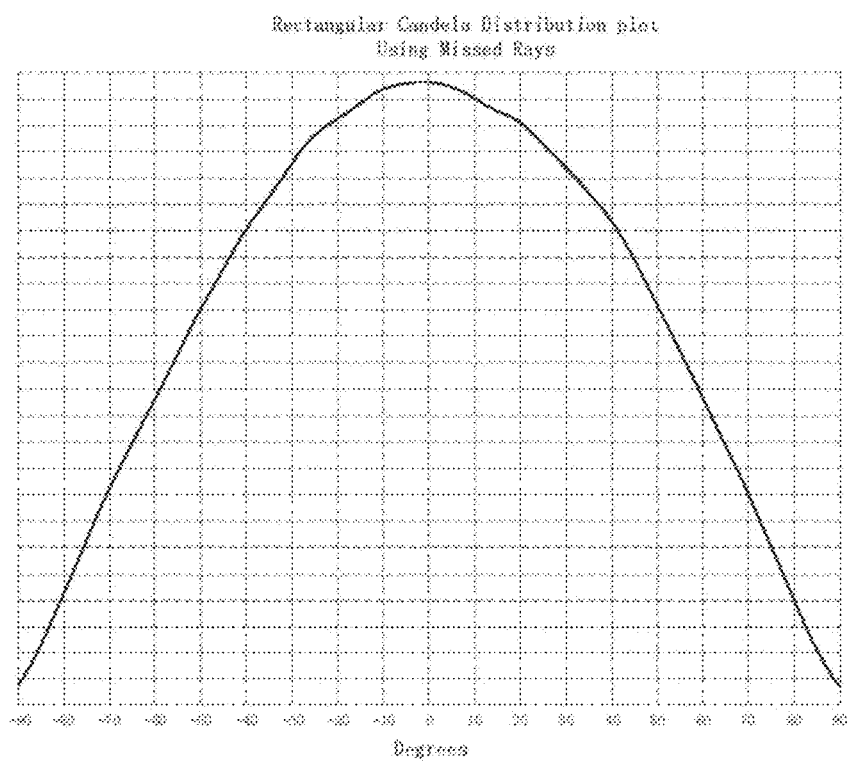
FIG. 1-1 illustrates a light distribution curve of an LED device known to the inventor.
Figures 1, 2:
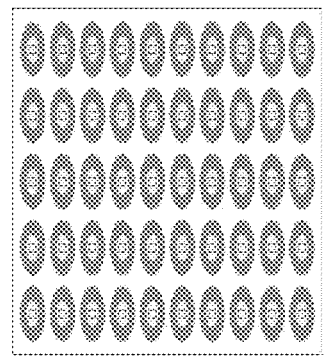
Figure 2:
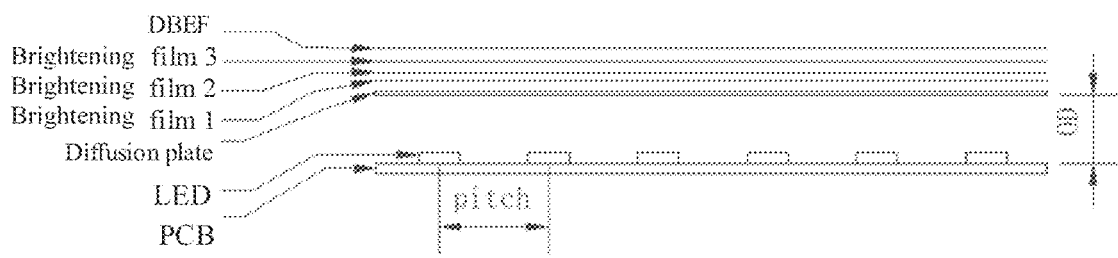
Figure 3:
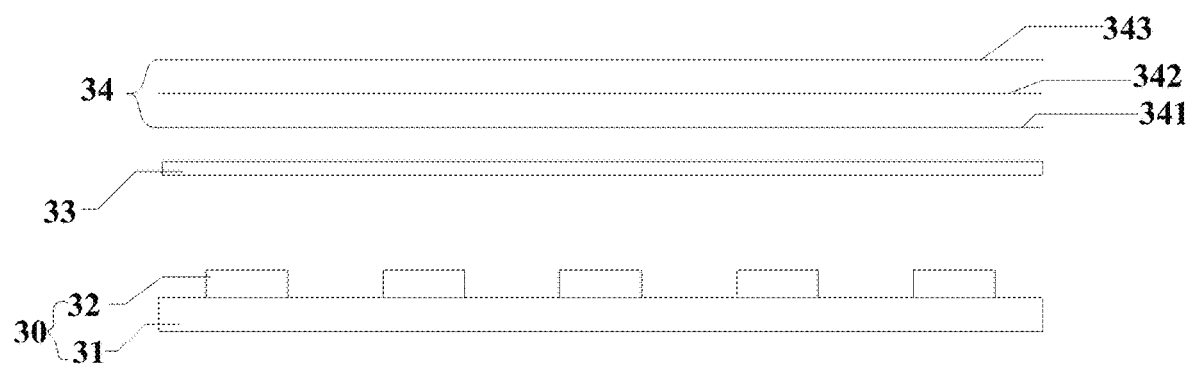
FIG. 3 illustrates a schematic view of a backlight module in accordance with an embodiment (1) of the present disclosure.
Figure 4:
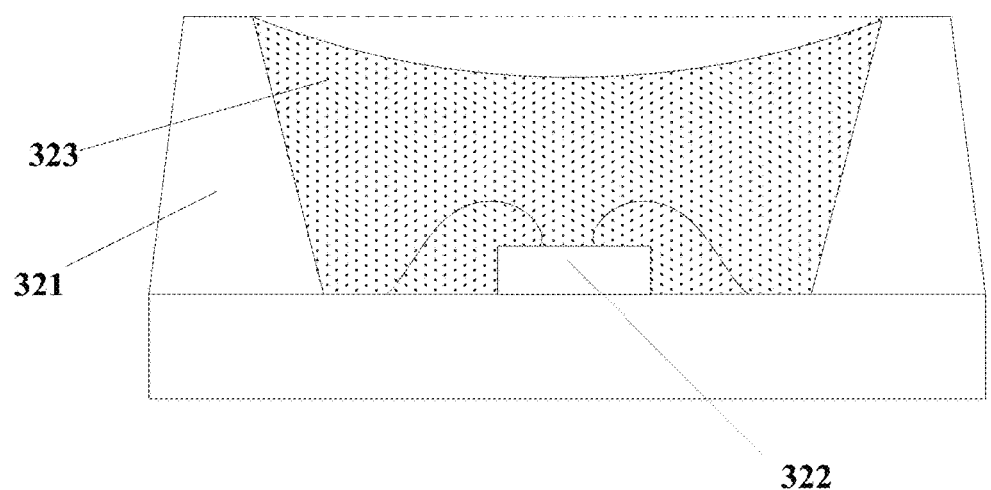
FIG. 4 illustrates a perspective view (1) of an LED device in accordance with the embodiment (1) of the present disclosure.

In order to solve the problem that the cost for the backlight module known to the inventor is larger as well as the backlight module fails to achieve the needs of thin and light as well as low energy consumption, in this embodiment, as shown in FIG. 3, a backlight module is provided. The backlight module comprises an LED light plate 30, a diffusion plate 33, and an optical film 34, where the diffusion plate 33 and the optical film 34 are sequentially arranged on the LED light plate 30. The LED light plate 30 comprises a driving circuit (not shown), a substrate 31, a plurality of LED devices 32 on the substrate 31. The driving circuit is provided for driving the operation of the LED devices 32. As shown in FIG. 4, the LED device 32 comprises a transparent LED frame 321, an LED chip 322 disposed on a bottom portion of the transparent LED frame 321, and a packaging glue layer 323 formed inside the transparent LED frame 321 and covering the LED chip 322. A diffusion agent is distributed in the packaging glue layer 323. The light emitted from the LED chip 322 is refracted by the diffusion agent and the packaging glue layer 323, so that the light emitted from the LED device can perform uniform illumination. Moreover, the light can be emitted out of the LED device from the side portions of the transparent LED frame 321 so as to increase the light illumination angle to achieve wide-angle illumination. Under such configuration, in the backlight module, the optical distance (OD) value (the distance between the upper surface of the substrate 31 and the lower surface of the diffusion plate 33) can be reduced, and the PITCH value (the distance between two LED devices) can be increased, thereby allowing the backlight module to be thin and light weighted. Moreover, because the LED device can provide wide-angle illumination, dark regions are not formed between LED devices even the OD value is reduced and the PITCH value is increased. Moreover, the OD/PITCH ratio of the backlight module can be configured in a range between 0.2 and 1, and the composition of the optical film 34 can be adjusted according to the OD/PITCH ratio, so that the backlight module can be further thinner and lighter while the light illumination intensity can be maintained. In one embodiment, when the OD/PITCH ratio is in a range between 0.3 and 1, the optical film 34 comprises, from inside to outside of the optical film 34, a brightening film 341, a microlens-prism composite film (MOP) 342, and a quantum dot optical film (QBEF) 343. The QBEF is an optical film made of quantum dot light-emitting materials. As compared to the OD/PITCH ratio of a backlight module known to the inventor (which is in a range between 0.8 and 1), the OD/PITCH ratio of the backlight module in this embodiment is reduced. Hence, with an existing film configuration, by reducing the number or the type of the films, the cost of the backlight module can be reduced, while proper optical performances of the LED backlight module can still be ensured.

According to one or some embodiments of the present disclosure, the LED device 32 with wide-angle and uniform illumination is described in the following paragraphs.

In this embodiment, the transparent LED frame 321 in the LED device comprises a substrate and a wall. In the transparent LED frame. 321, at least the wall is transparent. The wall may be made of transparent material(s), such as transparent resin, transparent thermoplastic plastic material (e.g., PPA (polyphthalamide)), and transparent thermosetting plastic material (e.g., EMC (epoxy molding compound)). Optically, in some embodiments, the substrate in this embodiment may be a metal substrate or may comprise a conductive material (such as copper), so that the LED chip 322 is electrically connected to the substrate. In some embodiment, both the substrate and the wall are made of transparent material(s), so that the light emitted from the LED chip 322 can be emitted out of the wall and the substate. The LED chip 322 is at a center portion of the substrate. The LED chip 322 may be a normally-arranged LED chip 322 and is electrically connected to the substrate through gold wires; alternatively, in some embodiments, the LED chip 322 may be a flip LED chip 322 and is electrically connected to the substrate through eutectic techniques.

Figure 5:
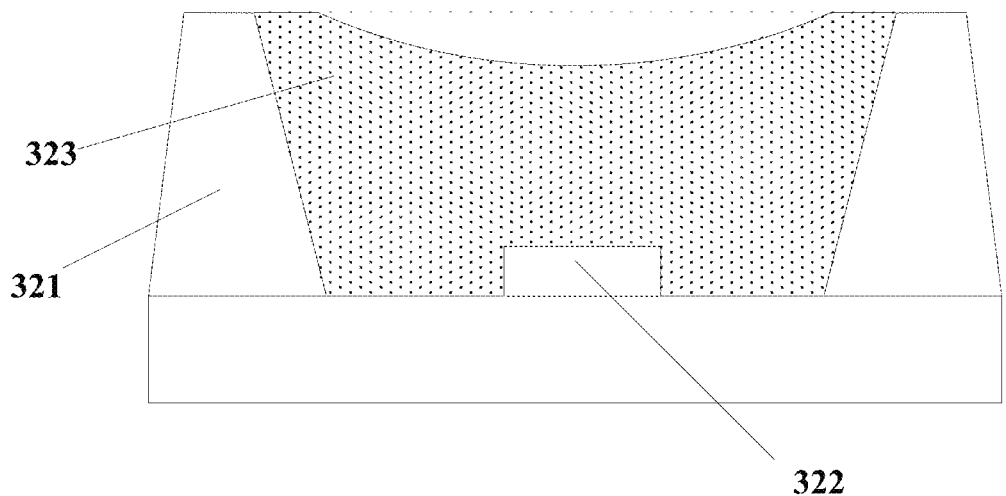
FIG. 5 illustrates a perspective view (2) of an LED device in accordance with the embodiment (1) of the present disclosure.
Figure 6:
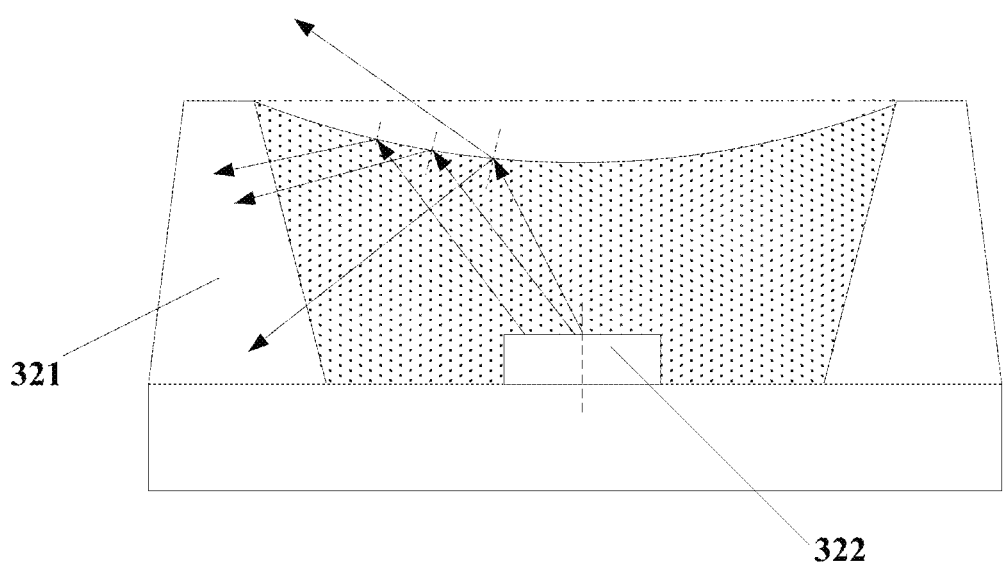
FIG. 6 illustrates a schematic diagram showing the light path on the inwardly concave structure of the packaging glue layer of an LED device in accordance with the embodiment (1) of the present disclosure.
Figure 7:
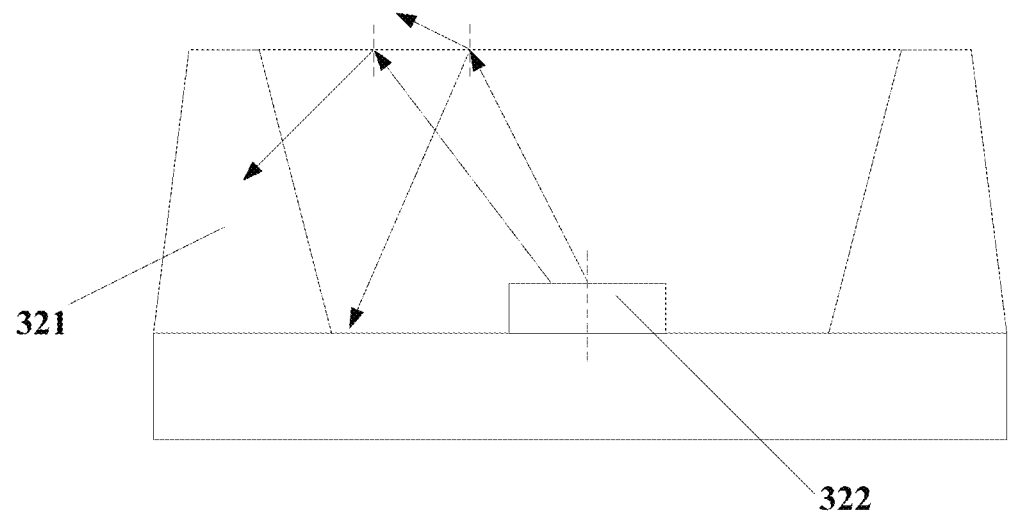
FIG. 7 illustrates a schematic diagram showing the light path on the packaging glue layer with a flat surface known to the inventor.

In this embodiment, the packaging glue layer 323 is a transparent glue layer which is formed after a transparent glue is solidified. The transparent glue may be, but not limited to, epoxy resin, silicone, and silicone resin. Of course, the packaging glue layer 32 may also be a fluorescent glue layer which is formed after a mixture of the transparent glue and fluorescent powders is solidified. It is understood that, for allowing the LED device 32 to have a wider illumination angle, a surface of the packaging glue layer 323 away from the bottom portion of the transparent LED frame 321 is an inwardly concave surface. The surface of the packaging glue layer 323 may be concaved inwardly right at a portion that the packaging glue layer 323 contacts the transparent LED frame 321, as shown in FIG. 4. Alternatively, in some embodiments, portions of the surface of the packaging glue layer 323 corresponding to the transparent LED frame 321 may be flat, and the inner portions of the surface of the packaging glue layer 323 are inwardly concaved, as shown in FIG. 5. The upper surface of the packaging glue layer 323 is concaved (from the cross-sectional view, the center portion of the surface is lower, while the side portion of the surface is higher), as shown in FIG. 6. The light is emitted from the LED chip 322, parts of the light are emitted out from the upper surface of the packaging glue layer 323, and then the reflected light is reflected to the substrate or the wall of the transparent LED frame 321. Parts of the light perform total reflection on the upper surface of the packaging glue layer 323, and the reflected light is directly reflected to the wall of the transparent LED frame 321 and then emitted into the air. As compared to the configuration of a backlight module known to the inventor shown in FIG. 7 where the upper surface of the packaging glue layer is flat, in this embodiment, the concave surface changes the normal line of the light, thereby changing the reflection angle and refraction angle, so that the light can be emitted to the transparent LED frame 321 more easily. Therefore, the light illumination of the LED device 32 can be performed uniformly, thus increasing the illumination angle of the LED device 32.

Optionally, in some embodiments, a lowest point of the packaging glue layer 323 is aligned with a center point of the LED chip 322 along the longitudinal direction, so that the LED device 32 can provide uniform and symmetrical illumination. In some embodiments, the height of the inwardly concave surface of the packaging glue layer 323 is in a range between 10 μm and 60 μm. In other words, the distance between the lowest point of the packaging glue layer 323 and the highest horizontal plane of the packaging glue layer 323 is in a range between 10 μm and 60 μm. According to some embodiments, with the packaging glue layer 323 having such slightly concave structure, the LED device 32 can provide a better illumination performance.

In order to increase the light scattering to enhance the optical diffusion performance of the LED device 32, in this embodiment, a diffusion agent is distributed in the packaging glue layer 323. The diffusion agent may be, but not limited to, diffusive particles (such as glass microbeads, resin microbeads). The diffusion agent is distributed in the packaging glue layer 323 uniformly. The amount of the diffusion agent is 1%-10%; that is, the amount of the diffusion agent over the packaging glue layer 323 is 1%-10%. In some embodiments, insufficient or excessive amount of the diffusion agent is avoided. The insufficient amount of the diffusion agent fails to provide the scattering effect, while the excessive amount of the diffusion agent may cause unwanted stray light refractions. However, in some embodiments, the amount of the diffusion agent can be flexibly adjusted according to practical requirements.

Figure 8:
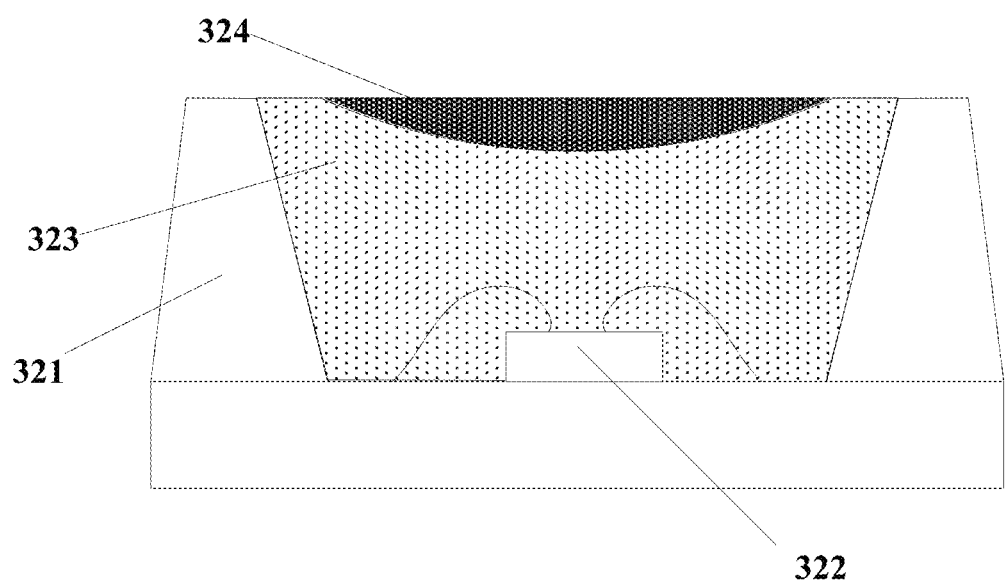
FIG. 8 illustrates a perspective view (3) of an LED device in accordance with the embodiment (1) of the present disclosure.
Figure 9:
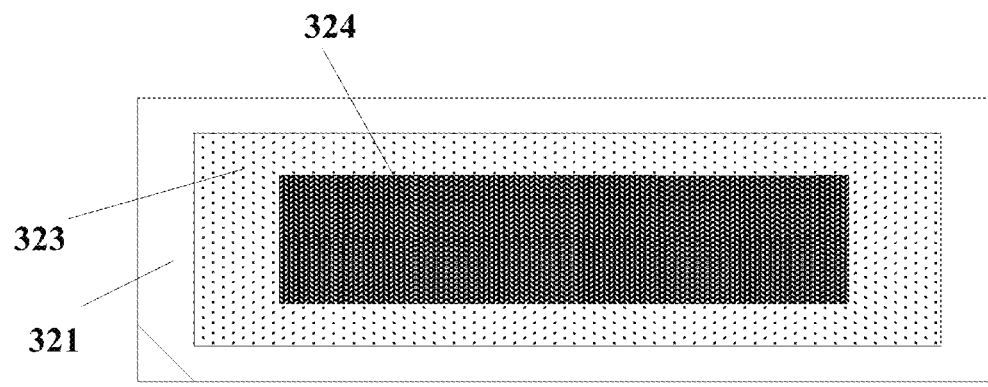
FIG. 9 illustrates a top view of the LED device shown in FIG. 8.

It is understood that, as shown in FIG. 8 and FIG. 9, in order to ensure the wide-angle illumination of the LED device 32, in this embodiment, the LED device further comprises an anti-glare light-blocking layer 324. In this embodiment, the anti-glare light-blocking layer 324 is at a center portion of the packaging glue layer 323. in other words, in this embodiment, the anti-glare light-blocking layer 324 is aligned with the center portion of the packaging glue layer 323, so that the light emitted from the LED device 32 can be symmetrical and uniform. Moreover, the anti-glare light-blocking layer 324 does not completely cover the packaging glue layer 323. In other words, in this embodiment, the anti-glare light-blocking layer 324 is disposed on the packaging glue layer 323, and the coverage area of the anti-glare light-blocking layer 324 is less than the area of the upper surface of the packaging glue layer 323. In some embodiments, the anti-glare light-blocking layer 324 covers 60%-95% of the area of the upper surface of the packaging glue layer 323, so that the anti-glare light-blocking layer 324 can block 60%-95% of the light emitted right from the top portion of the LED device 32 from passing through anti-glare light-blocking layer 324. Of course, the area of the anti-glare light-blocking layer 324 can be flexibly adjusted according to practical requirements. For example, the area of the anti-glare light-blocking layer 324 is 55%-96% of the area of the upper surface of the packaging glue layer 323.

In this embodiment, the height of the anti-glare light-blocking layer 324 is in a range between 10 μm and 30 μm. In other words, the difference between the highest point of the upper surface of the anti-glare light-blocking layer 324 and the lowest point of the lower surface of the anti-glare light-blocking layer 324 is in a range between 10 μm and 60 μm. The anti-glare light-blocking layer 324 is formed by the mixture of a transparent glue and white particles. The transparent glue may be, but not limited to, epoxy resin, silicone, and silicone resin. The white particles may be one of silicone dioxide, titanium dioxide, calcium carbonate, boron nitride. The weight percentage of the white particles is 10%-50%. In some embodiments, excessive amounts of the white particles will completely block the light emitted right from the top portion of the LED device 32, while insufficient amounts of the white particles will fail to block the light properly. Of course, the weight percentage of the white particles can be flexibly adjusted according to practical requirements.

Figure 10:
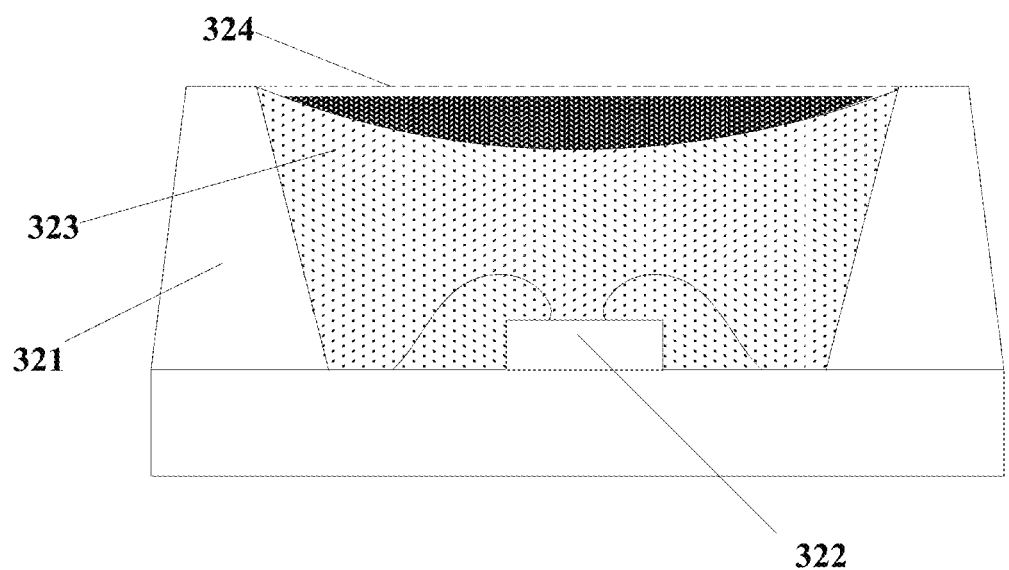
FIG. 10 illustrates a perspective view (4) of an LED device in accordance with the embodiment (1) of the present disclosure.

It is understood that, in this embodiment, at least one of the surfaces of the anti-glare light-blocking layer 324 is not a flat surface; the upper surface and/or the lower surface of the anti-glare light-blocking layer 324 may be not flat. As shown in FIG. 8, the lower surface of the anti-glare light-blocking layer 324 contacting the packaging glue layer 323 is an inwardly concave surface, and the shape of the upper surface of the anti-glare light-blocking layer 324 exposed to ambient air can be flexibly adjusted with different manufacturing techniques. For example, in the case that the anti-glare light-blocking layer 324 is manufactured through molding, the upper surface of the anti-glare light-blocking layer 324 exposed to ambient air is a flat surface; while in the case that the anti-glare light-blocking layer 324 is manufactured through glue-dispensing techniques, the upper surface of the anti-glare light-blocking layer 324 exposed to ambient air is an inwardly concave surface in which a middle portion of the surface is slightly concaved. Parts of the light emitted from the LED chip 322 are refracted by the inwardly concaved lower surface and the flat upper surface of the anti-glare light-blocking layer 324, and most parts of the light are emitted from two sides of the LED device 32, thereby increasing the light illumination angle of the LED device 32. It is understood that, in this embodiment, the height of the inwardly concave surface of the packaging glue layer 323 is the same as the height of the anti-glare light-blocking layer 324. Of course, in some embodiments, the height of the inwardly concave surface of the packaging glue layer 323 is greater than the height of the anti-glare light-blocking layer 324, as shown in FIG. 10.

Figure 11:
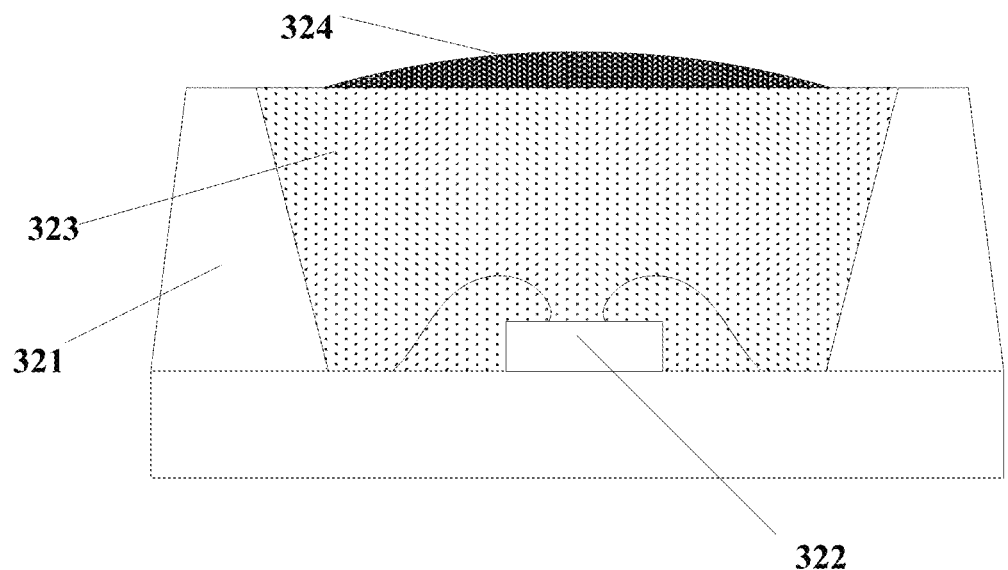
FIG. 11 illustrates a perspective view (5) of an LED device in accordance with the embodiment (1) of the present disclosure.

In this embodiment, another anti-glare light-blocking layer 324 is also provided. As shown in FIG. 11, the lower surface of the anti-glare light-blocking layer 324 contacting the packaging glue layer 323 is a flat surface, and the upper surface of the anti-glare light-blocking layer 324 exposed to ambient air is an outwardly convex surface. In other words, the lower surface of the anti-glare light-blocking layer 324 is flat, and the upper surface of the anti-glare light-blocking layer 324 is outwardly convex. Parts of the light are refracted by the upper surface of the anti-glare light-blocking layer 324, and the light emitting from the center of the LED device 32 is decreased. Therefore, the light is emitted out of the LED device 32 from two sides of the LED device 32, thereby increasing the illumination angle of the LED device 32. In this embodiment, the upper surface of the packaging glue layer 323 is flat.

In some embodiments, yet another anti-glare light-blocking layer 324 is also provided. The lower surface of the anti-glare light-blocking layer 324 contacting the packaging glue layer 323 is a flat surface, and the upper surface of the anti-glare light-blocking layer 324 exposed to ambient air is an inwardly concave surface. In other words, the lower surface of the anti-glare light-blocking layer 324 is flat, and the upper surface of the anti-glare light-blocking layer 324 is an inwardly concave surface in which a middle portion of the surface is slightly concaved. In some embodiment, an anti-glare light-blocking layer 324 in which both the upper surface and the lower surface of the anti-glare light-blocking layer 324 are flat is also provided. The lower surface of the anti-glare light-blocking layer 324 contacting the packaging glue layer 323 is a flat surface, and the upper surface of the anti-glare light-blocking layer 324 exposed to ambient air is also a flat surface. In other words, both the upper surface and the lower surface of the anti-glare light-blocking layer 324 are flat surfaces. Parts of the light are reflected by the lower surface and refracted by the upper surface and emitted out of the LED device 32 from two sides of the LED device 32, thereby increasing the illumination angle of the LED device 32.

Figure 12:
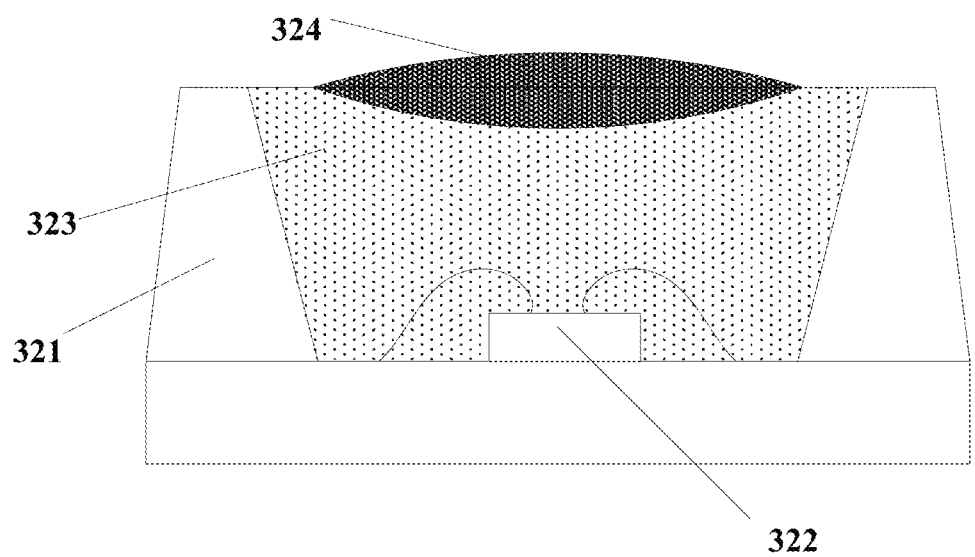
FIG. 12 illustrates a perspective view (6) of an LED device in accordance with the embodiment (1) of the present disclosure.

In some embodiments, both the upper surface and the lower surface of the anti-glare light-blocking layer 324 are non-flat surfaces. As shown in FIG. 12, the upper surface of the anti-glare light-blocking layer 324 exposed to ambient air is an outwardly convex surface, and the lower surface of the anti-glare light-blocking layer 324 contacting the packaging glue layer 323 is an inwardly concave surface. Parts of the light are reflected by the lower surface and emitted out of the LED device 32 from the two sides of the LED device 32, parts of the light are refracted by the upper surface to change the illumination angle of the light. In this embodiment, the packaging glue layer 323 is an inwardly concave structure.

In this embodiment, an LED device 32 is provided and comprises a transparent LED frame 321, an LED chip 322 disposed on a bottom portion of the transparent LED frame 321, and a packaging glue layer 323 formed inside the transparent LED frame 321 and covering the LED chip 322. A diffusion agent is distributed in the packaging glue layer 323. The light emitted out of the LED chip 322 through the frame. The diffusion agent is provided in the packaging glue layer 323. Moreover, in some embodiments, the upper surface of the packaging glue layer 323 is inwardly concaved, and the light emitted from the LED chip 322 is refracted by the diffusion agent and the packaging glue layer 323. Therefore, the LED device 32 can provide a symmetrical and uniform illumination performance.

Figure 13:
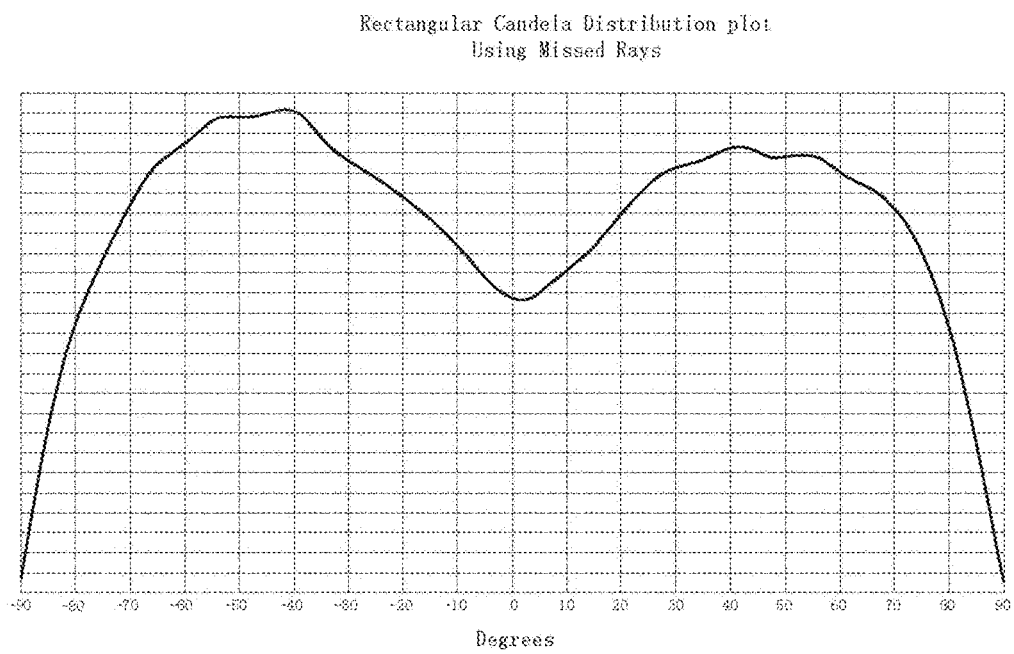
FIG. 13 illustrates a schematic light distribution curve of an LED device with a transparent frame and an anti-glare light-blocking layer in accordance with the embodiment (1) of the present disclosure.
Figure 14:
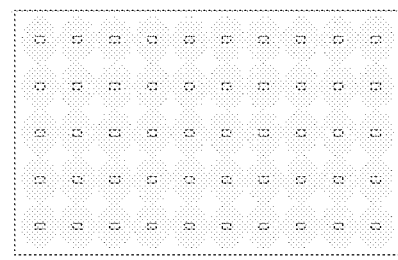
FIG. 14 illustrates a schematic simulation view of an LED device in accordance with the embodiment (1) of the present disclosure.

Moreover, in some embodiments, an anti-glare light-blocking layer 324 is disposed on the packaging glue layer 323, and the area of the anti-glare light-blocking layer 324 is less than the area of the upper surface of the packaging glue layer 323. The anti-glare light blocking layer 324 can block 60%-90% of the light emitted right from the top portion of the LED device 32 from passing through the anti-glare light-blocking layer 324, thereby reducing the optical intensity of the light emitted right from the top portion of the LED device 32. Therefore, more parts of the light are emitted out of the LED device 32 from the two sides of the LED device 32, thereby increasing the illumination angle of the LED device 32. Moreover, because the anti-glare light-blocking layer 324 does not cover the packaging glue layer 323 completely, parts of the light can be emitted right from the top portion of the LED device 32, thereby achieving wide-angle and uniform illumination of the LED device 32. Please refer to FIG. 13. FIG. 13 illustrates a schematic light distribution curve of an LED device with a transparent frame and an anti-glare light-blocking layer. As shown in FIG. 13, the light distribution curve is a bimodal curve. In some embodiments, under the basis that the LED device has the transparent LED frame, the anti-glare light-blocking layer is disposed on the packaging glue layer which is inside the frame. Therefore, because the anti-glare light-blocking layer blocks most of the light emitted right from the top portion of the LED device from passing through the anti-glare light-blocking layer, the optical intensity of the light emitted right from the top portion of the LED device can be reduced. Therefore, by blocking the light from being emitted right from the top portion of the LED device, the light is reflected and emitted out of the LED device from the transparent frame. Hence, the optical intensity of the light emitted from the two sides of the LED device and the illumination angle of the LED device can be increased. As seen in the light distribution curve, by taking the top portion of the light emitting surface of the LED device as the center, the optical intensities of the light emitted from portions within 180 degrees are commensurate with each other. FIG. 14 illustrates a schematic simulation view of an LED device 32.

Figure 15:
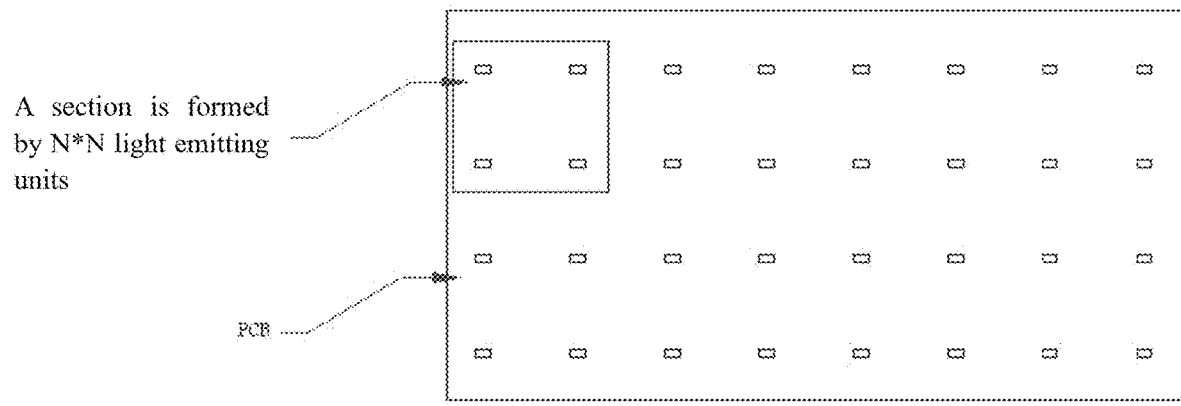
FIG. 15 illustrates a schematic view of a section of the backlight module known to the inventor.
Figure 16:
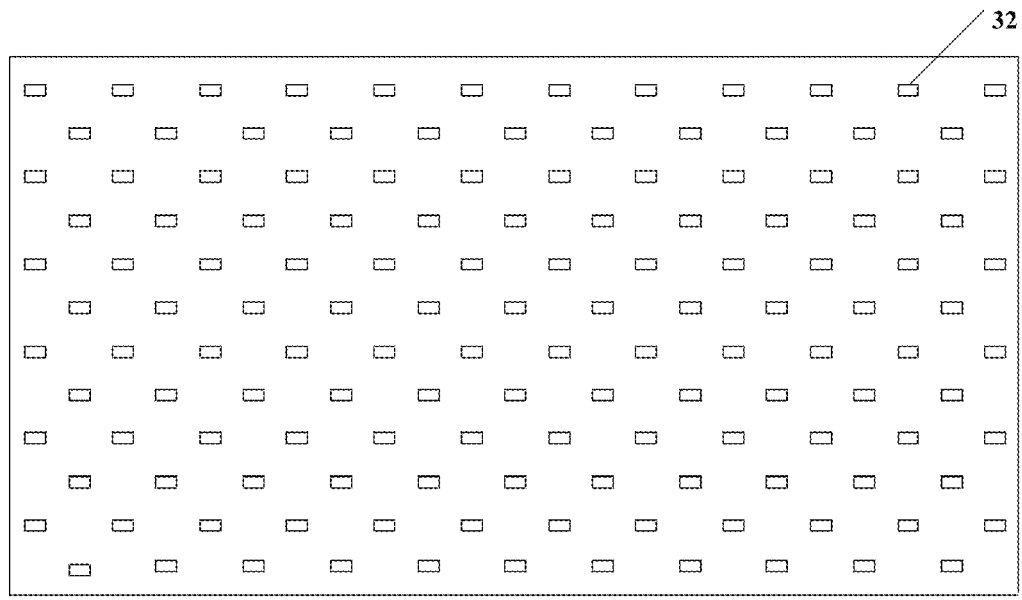
FIG. 16 illustrates a schematic view showing the arrangement of the LED devices on the LED backlight module in accordance with one or some embodiments of the present disclosure.

It is understood that, regarding a backlight module known to the inventor, the module is divided into several sections, and the light of the backlight module can be controlled independently. Therefore, according to the brightness requirements at different sections, different sections can be provided with different light brightness. Hence, the bright sections are much brighter, and the dark sections are much darker, thereby achieving a better contrast ratio. As shown in FIG. 15, regarding a backlight module known to the inventor, the LED devices are arranged into an array, and N*N LED devices are contained in one section. As a result, the number in one section is larger, and the OD/PITCH ratio is larger and close to 1.0. Hence, the backlight module achieves normal uniformity. In order to solve the problems, in this embodiment, the arrangement of the LED devices 32 on the substrate 31 is optimized. Specifically, in this embodiment, adjacent two rows of the LED devices 32 on the substrate 31 are misaligned with each other, as shown in FIG. 16. In some embodiments, adjacent two columns of the LED devices 32 on the substrate 31 are misaligned with each other. As compared with the array-arrangement, the misaligned-arrangement of the LED devices 32 reduces the total number of the LED devices 32 in the backlight module while allowing the LED devices 32 to be distributed over the substrate 31 more uniformly.

It is understood that, under the basis that LED devices 32 are misaligned, in this embodiment, the LED devices 32 can be divided into sections. Taking that adjacent two rows of the LED devices 32 on the substrate 31 are misaligned with each other as an example, in this embodiment, the substrate 31 comprises a plurality of sections 35 defined by the LED devices 32, and each of the sections 35 comprises at least two of the LED devices 32. In one embodiment, the areas of the sections 35 are the same, the number of the LED devices 32 in each of the sections can be flexibly adjusted according to practical requirements, and the arrangement of the LED devices 32 in the section 35 can be flexibly adjusted according to the number of the LED devices 32.

Figure 17:
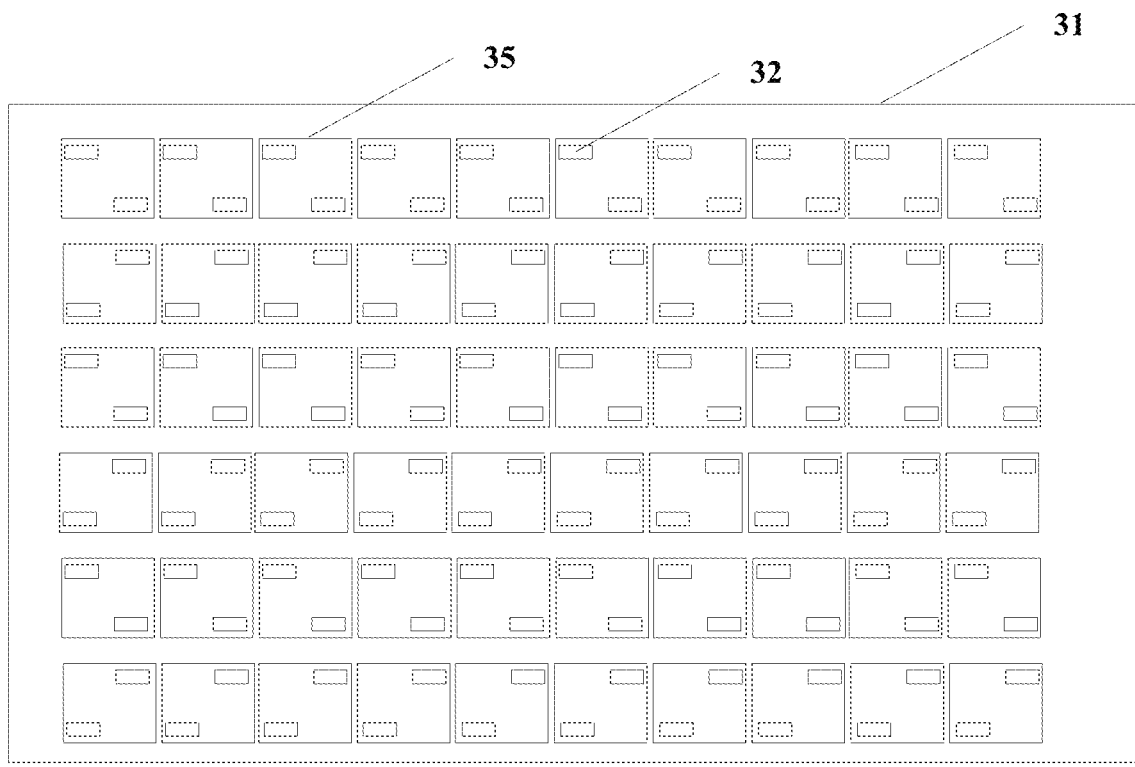
FIG. 17 illustrates a schematic view (1) showing the sections of the LED devices on an LED light plate in accordance with one or some embodiments of the present disclosure.
Figure 18:
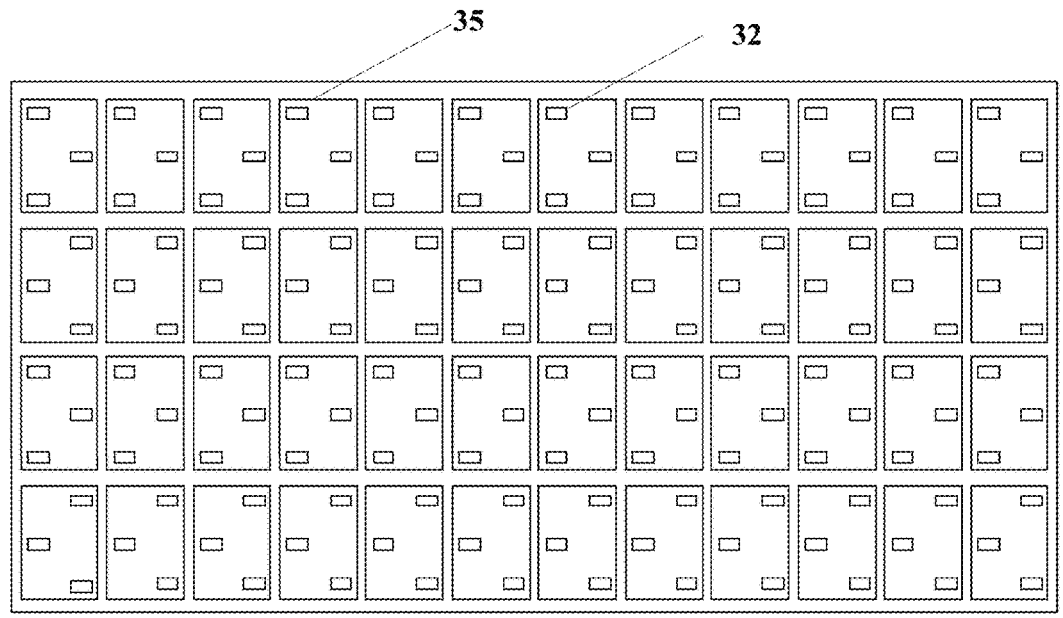
FIG. 18 illustrates a schematic view (2) showing the sections of the LED devices on an LED light plate in accordance with one or some embodiments of the present disclosure.
Figure 19:
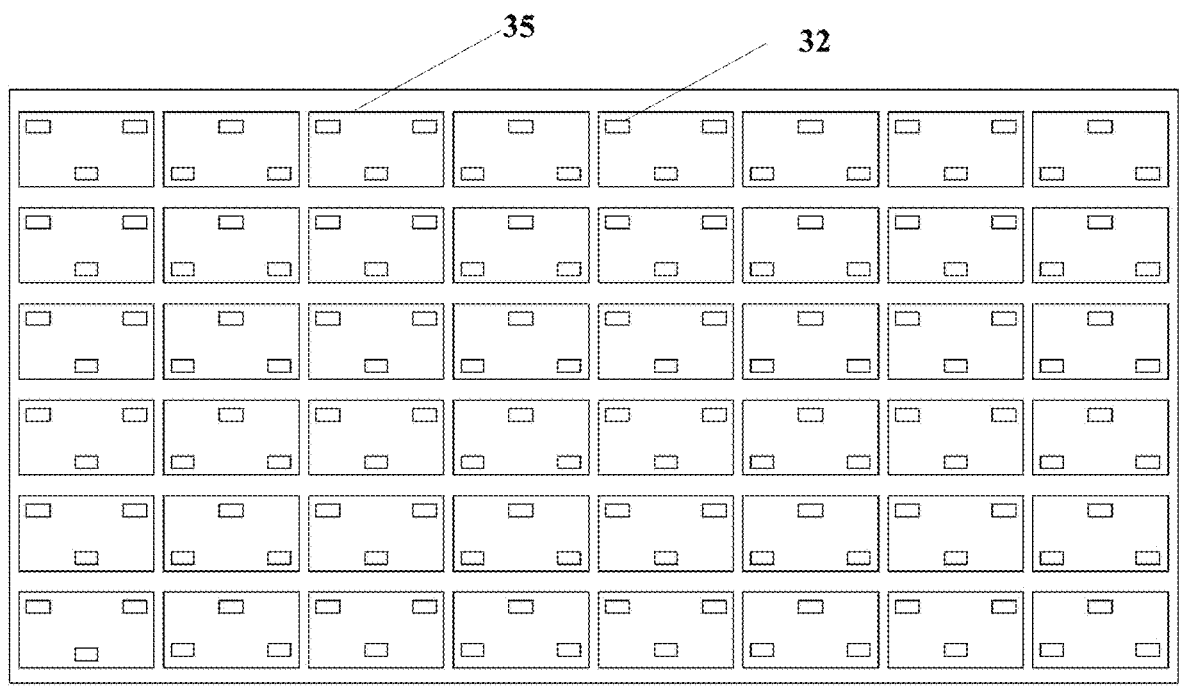
FIG. 19 illustrates a schematic view (3) showing the sections of the LED devices on an LED light plate in accordance with one or some embodiments of the present disclosure.

In this embodiment, the substrate 31 comprises the sections 35 which are configured as only one type. In the case that the section 35 comprises two LED devices 32, these two LED devices 32 in the section 35 are arranged along the same slant line, as shown in FIG. 17. In the case that the section 35 comprises three LED devices 32, the three LED devices 32 in the section 35 are arranged as a triangle, so that the shape of the light emission region projected by the section 35 is close to a circle, and the backlight module can provide more uniform brightness in a larger area. As shown in FIG. 18, the section 35 comprises three LED devices 32 which are arranged as a 3*2 array (where some of the elements of the array are empty, and the LED devices 32 are arranged alternately), and the directions of the triangles in adjacent two rows of the sections 35 are opposite to each other. As shown in FIG. 19, the section 35 comprises three LED devices 32 which are arranged as a 3*2 array (where some of the elements of the array are empty, and the LED devices 32 are arranged alternately).

Figure 20:
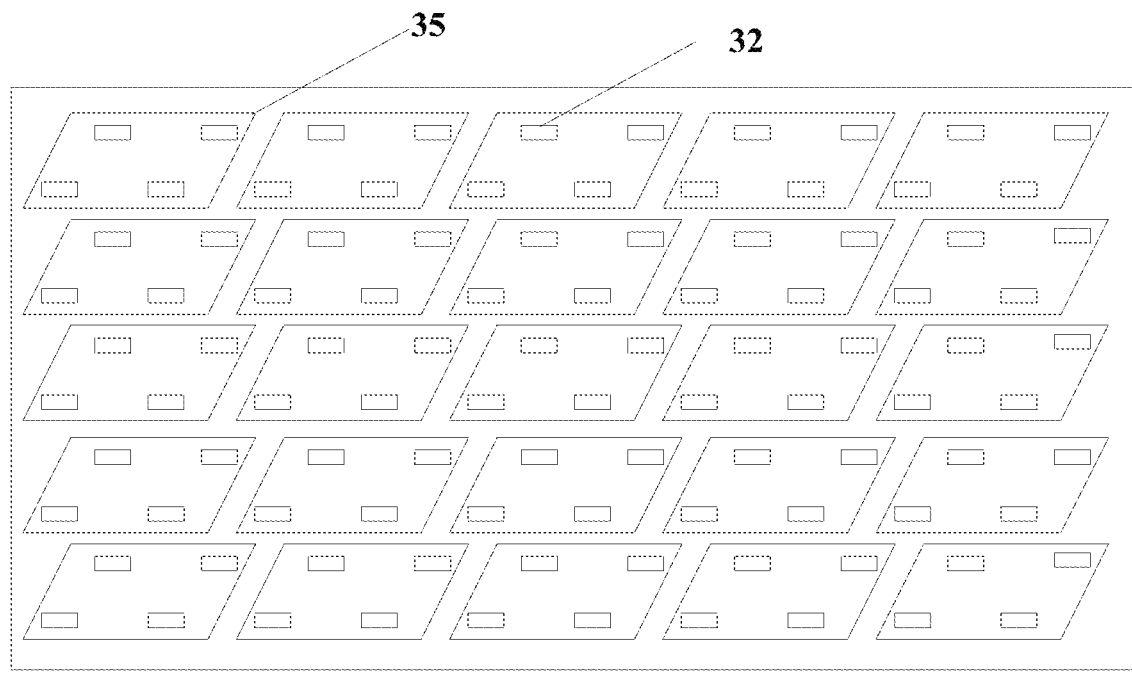
FIG. 20 illustrates a schematic view (4) showing the sections of the LED devices on an LED light plate in accordance with one or some embodiments of the present disclosure.
Figure 21:
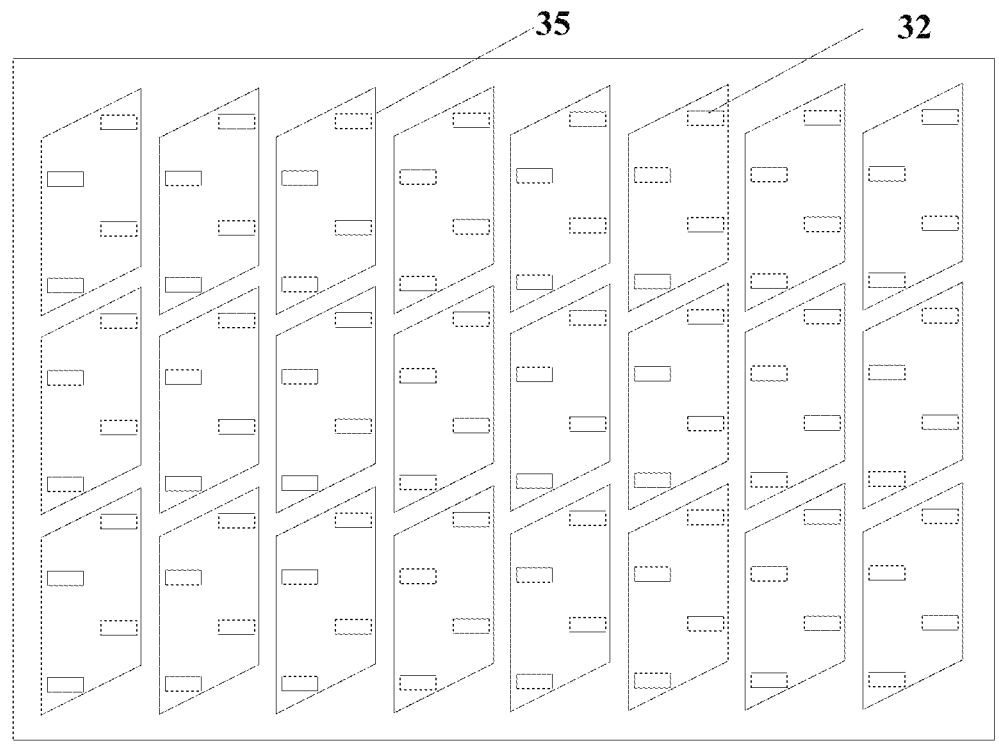
FIG. 21 illustrates a schematic view (5) showing the sections of the LED devices on an LED light plate in accordance with one or some embodiments of the present disclosure.

In this embodiment, the section 35 comprises four LED devices 32, and the LED devices 32 of the section 35 are arranged as a 2*4 parallelogram array (where some of the elements of the array are empty, and the LED devices 32 are arranged alternately). As shown in FIG. 20, in this embodiment, the LED devices 32 in the section 35 are arranged as a parallelogram, and adjacent two rows of the sections 35 are misaligned with each other. In some embodiments, the section 35 comprises four LED devices 32 which are arranged as a 4*2 parallelogram array (where some of the elements of the array are empty, and the LED devices 32 are arranged alternately). As shown in FIG. 21, in this embodiment, adjacent two columns of the sections 35 are misaligned with each other.

Figure 22:
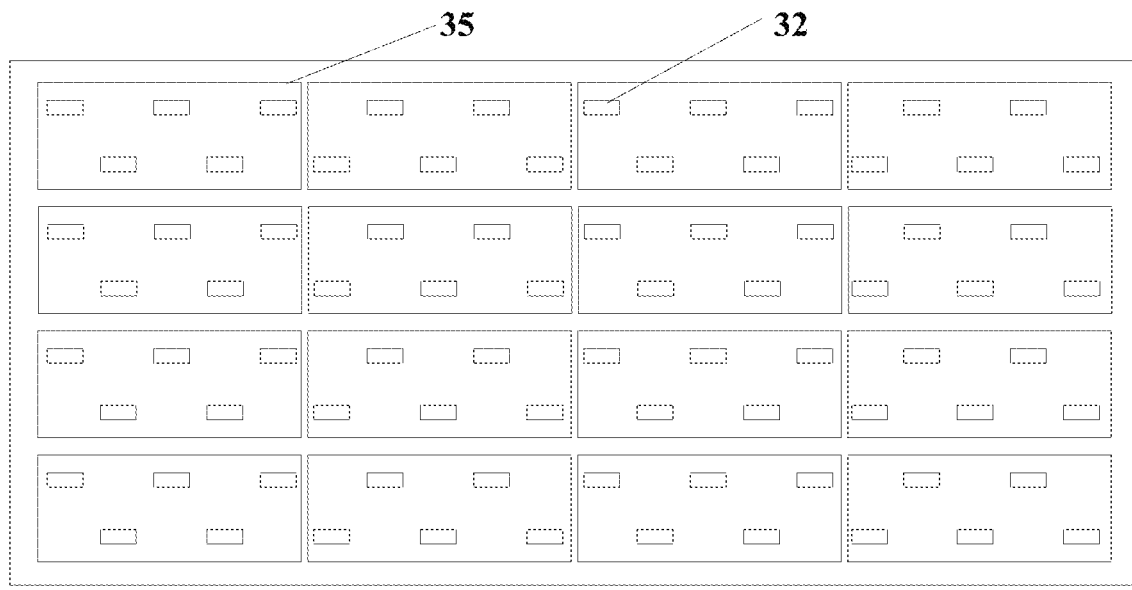
FIG. 22 illustrates a schematic view (6) showing the sections of the LED devices on an LED light plate in accordance with one or some embodiments of the present disclosure.
Figure 23:
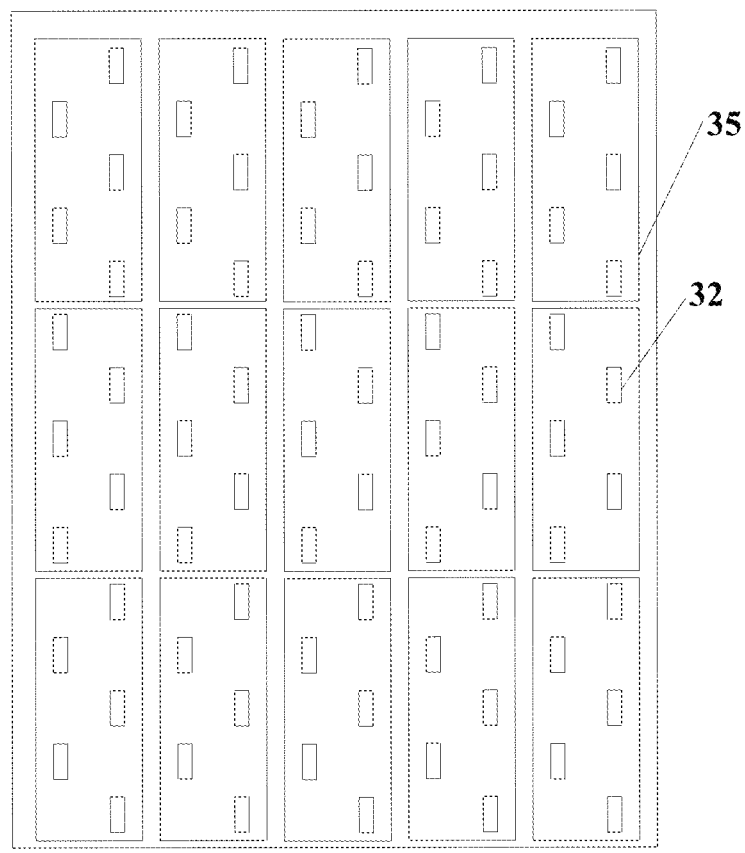
FIG. 23 illustrates a schematic view (7) showing the sections of the LED devices on an LED light plate in accordance with one or some embodiments of the present disclosure.

In this embodiment, the section 35 comprises five LED devices 32, and the LED devices 32 of the section 35 are arranged as a 2*5 array (where some of the elements of the array are empty, and the LED devices 32 are arranged alternately). As shown in FIG. 22, in this embodiment, the LED devices 32 in the section 35 are arranged as a rectangle or a trapezoid. In some embodiments, the LED devices 32 of the section 35 are arranged as a 5*2 array (where some of the elements of the array are empty, and the LED devices 32 are arranged alternately), and the LED devices 32 in the section 35 are arranged as a rectangle or a trapezoid, as shown in FIG. 23.

It is understood that, in this embodiment, the number of the LED devices 32 in the section 35 is as less as possible. The brightness of the LED devices 32 in different sections 35 are respectively controlled by different circuits. When the number of the LED devices 32 in the section 35 is small, the coverage area of the light of the section 35 is also small, and the brightness difference between different sections 35 is not apparent. In this embodiment, the section 35 comprises two, three, four, or five LED devices 32, but embodiments are not limited thereto. In practical applications, the arrangement and the number of the LED devices 32 in the section 35 can be flexibly adjusted according to practical requirements.

Figure 24:
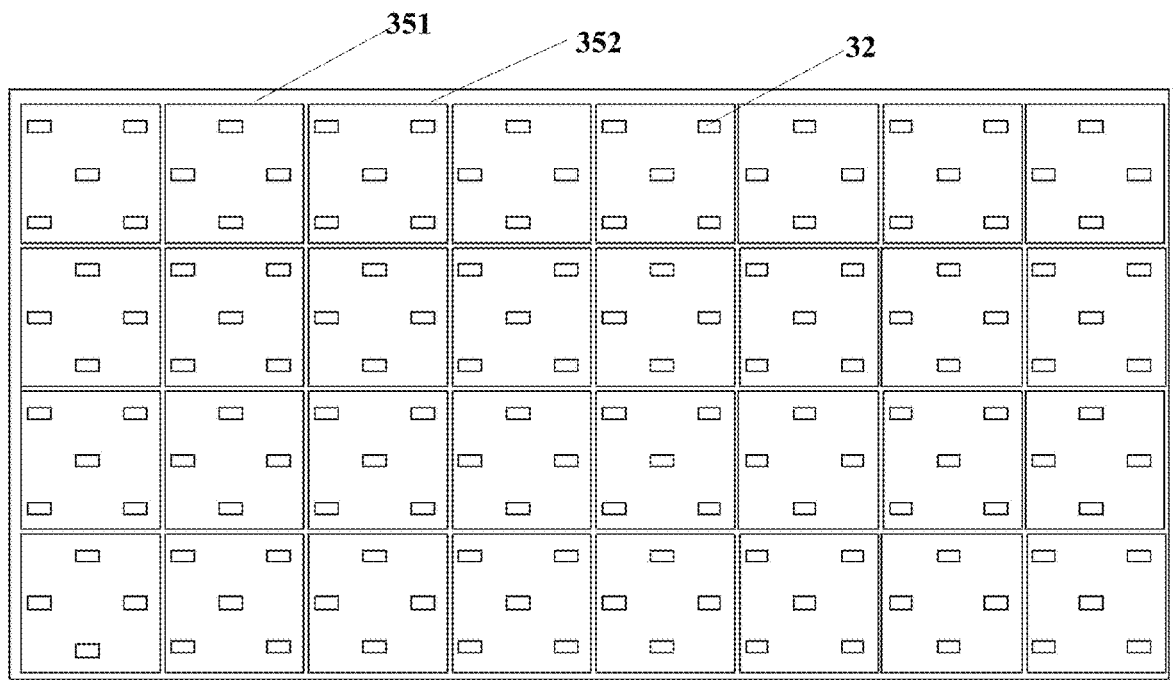
FIG. 24 illustrates a schematic view (8) showing the sections of the LED devices on an LED light plate in accordance with one or some embodiments of the present disclosure.

In this embodiment, the substrate 31 comprises the sections 35 which are configured as at least two types. In the two types of the sections 35, the arrangements of the LED devices 32 are different. For example, the number of the LED devices 32 in a first section 351 is different from the number of the LED devices 32 in a second section 352. In some embodiments, the LED devices 32 are misaligned with each other, the areas of the sections 35 in different are the same, and under the basis that the number of the LED devices 32 in the section 35 is as less as possible, a first section 351 comprises five LED devices 32, and a second section 352 comprises four LED devices 32. As shown in FIG. 24, the adjacent two sections 35 respectively comprise four LED devices 32 which are arranged as a 3*3 array and five LED devices 32 which are arranged as a 3*3 array (where some of the elements of the array are empty, and the LED devices 32 are arranged alternately). Under the basis that the LED devices 32 are misaligned with each other, the five LED devices 32 in the 3*3 array are formed as an X profile, and the four LED devices 32 in the 3*3 array are formed as a diamond shape. Through the arrangement of the X profile and the diamond shape of the LED devices 32, the light emission region of the LED devices 32 can cover the peripheral portion and the center of the section 35. Therefore, the backlight module can provide more uniform illumination in a larger area.

Figure 25:
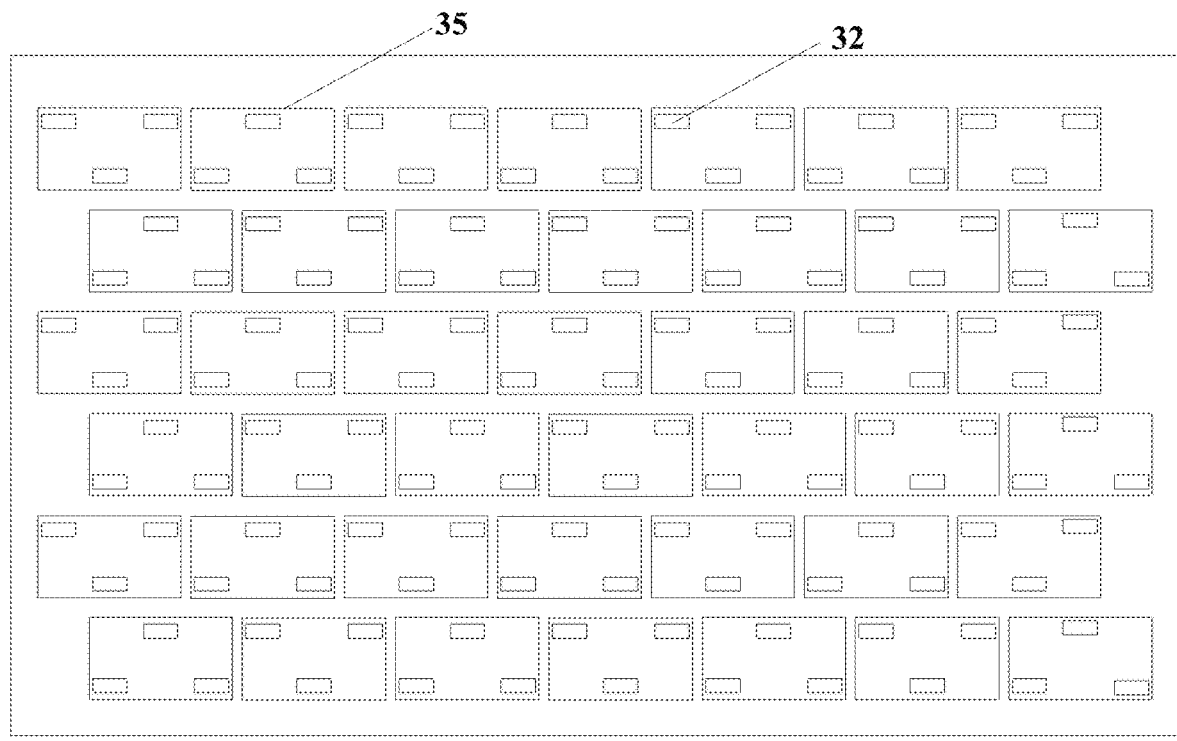
FIG. 25 illustrates a schematic view (9) showing the sections of the LED devices on an LED light plate in accordance with one or some embodiments of the present disclosure.

It is understood that, in some embodiments, adjacent two rows and/or two columns of the sections 35 are misaligned with each other. Taking the adjacent two rows of the sections 35 are misaligned with each other as an example, the offset distances between any adjacent two rows of the sections 35 are the same. As shown in FIG. 25, a section 35 at a center of the substrate 31 is adjacent to and surrounded by six neighboring sections 35. Therefore, upon controlling the brightness based on the sections 35, the mosaic phenomenon of the backlight module can be reduced, thus allowing the display with the backlight module to have uniform brightness.

Embodiment (2)

Figure 26:
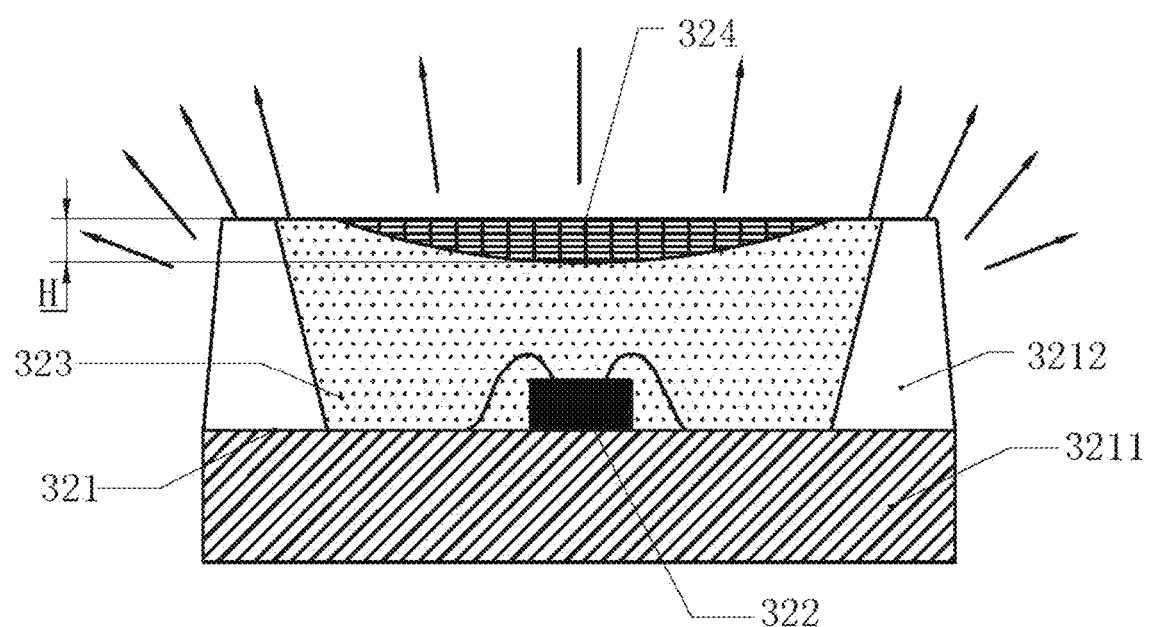
FIG. 26 illustrates a perspective view of an LED device in accordance with an embodiment (2) of the present disclosure.

In this embodiment, an LED device 32 is provided. As shown in FIG. 26, the LED device 32 comprises a transparent LED frame 321, an LED chip 322 disposed on a bottom portion of the transparent LED frame 321, and a packaging glue layer 323 formed inside the transparent LED frame 321 and covering the LED chip 322. A diffusion agent is distributed in the packaging glue layer 323. An anti-glare light-blocking layer 324 is disposed on the packaging glue layer 323, and the area of the anti-glare light-blocking layer 324 is less than the area of the upper surface of the packaging glue layer 323.

In this embodiment, the transparent LED frame 321 comprises a substrate 3211 and a wall 3212. The wall 3212 is made of transparent material(s), so that the light can be emitted out of the wall 3212. The substrate is made of conductive material(s), so that the LED chip 322 is electrically connected to the substrate 3211. In this embodiment, the LED chip 322 is a normally-arranged LED chip 322, is electrically connected to the substrate 3211 of the transparent LED frame 321 through gold wires, and is at a center portion of the substrate 3211.

In this embodiment, the packaging glue layer 323 formed by a transparent glue. The upper surface of the packaging glue layer 323 is concaved (from the cross-sectional view, the center portion of the surface is lower, while the side portion of the surface is higher), so that the packaging glue layer 323 is an inwardly concave structure. In some embodiments, a lowest point of the packaging glue layer 323 is aligned with a center point of the LED chip 322 along the longitudinal direction, so that the LED device 32 can provide uniform and symmetrical illumination. In this embodiment, the distance between the lowest point of the packaging glue layer 323 and the highest horizontal plane of the upper surface of the wall 3212 is in a range between 10 μm and 60 μm. for example, the height of the inwardly concave surface is 30 μm. The concave surface of the packaging glue layer 323 changes the normal line of the light, thereby changing the reflection angle and refraction angle of the light to increase the reflection angle and the refraction angle, so that the light can be emitted from the wall 3212 of the transparent LED frame 321 more easily. The diffusion agent is uniformly distributed in the packaging glue layer 323. The light emitted from the LED chip 322 is continuously reflected by the diffusion agent and refracted by the packaging glue layer 323, so that the LED device 32 can provide uniform illumination. The amount of the diffusion agent over the packaging glue layer 323 is 1%-10%. For example, the amount of the diffusion agent is 5%.

In this embodiment, the anti-glare light-blocking layer 324 is disposed on the packaging glue layer 323. The anti-glare light-blocking layer 324 does not completely cover the packaging glue layer 323. The center point of the anti-glare light-blocking layer 324 is aligned with the center point of the packaging glue layer 323. The anti-glare light-blocking layer 324 covers 60%-95% of the area of the upper surface of the packaging glue layer 323 to block 60%-90% of the light emitted right from the top portion of the LED device 32 from passing through the anti-glare light-blocking layer 324, thereby reducing the optical intensity of the light emitted right from the top portion of the LED device 32. Therefore, more parts of the light are emitted out of the LED device 32 from the two sides of the LED device 32, thereby increasing the illumination angle of the LED device 32. The anti-glare light-blocking layer 324 is a mixture of a transparent glue (epoxy resin, silicone, and silicone resin) and white particles (the white particles may be silicone dioxide, titanium dioxide, calcium carbonate, boron nitride). The concentration of the white particles over the mixture is 10%-50%. For example, the concentration of the white particles over the mixture is 25%.

It is understood that, in this embodiment, the anti-glare light-blocking layer 324 is an inwardly concave structure. That is, in this embodiment, the lower surface of the anti-glare light-blocking layer 324 contacting the packaging glue layer 323 is an inwardly concave surface. In this embodiment, the height of the anti-glare light-blocking layer 324 is the same as the height of the height of the inwardly concave surface of the packaging glue layer 323. In other words, in this embodiment, the packaging glue layer 323 seamlessly contacts the anti-glare light-blocking layer 324. Parts of the light emitted from the LED chip 322 are refracted by the inwardly concaved lower surface and the flat upper surface of the anti-glare light-blocking layer 324, and most parts of the light are emitted from two sides of the LED device 32, thereby increasing the light illumination angle of the LED device 32.

As above, in some embodiments of the present disclosure, an LED light plate is further provided. The LED light plate comprises a driving circuit, a substrate, and a plurality of LED devices on the substrate. As shown in FIG. 3, the light plate comprises a substrate 31, a plurality of LED devices 32 on the substrate 31, a diffusion plate 33 on the LED devices 32, a brightening film on the diffusion plate 33, an MOP film on the brightening film, and a QBEF film on the MOP film, where the OD/PITCH ratio of the backlight module is in a range between 0.3 and 1. The LED devices 32 on the substrate 31 are regularly arranged; specifically, in some embodiments, adjacent two rows of the LED devices 32 are misaligned with each other.

In this embodiment, the LED devices can be divided into sections, and the division rule of the substrate is that, the LED devices are misaligned with each other, the areas of the sections are the same, and the number of the LED devices in the section is as less as possible. For example, as shown in FIG. 24, the substrate comprises the sections which are configured as two types, one type of the section 35 comprises five LED devices 32 which are arranged as a 3*3 array and formed as an X profile, and the other type of the section comprises four LED devices 32 which are arranged as a 3*3 array and formed as a diamond shape. Through the arrangement of the X profile and the diamond shape of the LED devices 32, the light emission region of the LED devices 32 can cover the peripheral portion and the center of the section. Therefore, the backlight module can provide more uniform illumination in a larger area.

In this embodiment, an LED device is provided and comprises a transparent frame. The diffusion agent (1%-19%) is added in the packaging glue (which is for forming the packaging glue layer). The upper surface of the packaging glue layer is a circular concave structure. The light emitted out of the transparent LED frame is continuously reflected by the diffusion agent and refracted by the packaging glue layer, so that the LED device can provide uniform and symmetrical illumination. The anti-glare light-blocking layer is disposed on the packaging glue layer. The anti-glare light-blocking layer is a mixture of a transparent glue and white particles. The concentration of the white particles over the mixture is 10%-50%. The anti-glare light-blocking layer is an inwardly concave structure and does not completely cover the packaging glue layer. The center point of the anti-glare light-blocking layer is aligned with the center point of the packaging glue layer. The covering area of the anti-glare light-blocking layer is 60%-95% of the area of the packaging glue layer. Therefore, the optical intensity of the light emitted right from the top portion of the LED device can be reduced. Hence, more parts of the light are emitted out of the LED device from the two sides of the LED device, thereby allowing the LED device to have wide-angle and uniform illumination.

Furthermore, in this embodiment, a backlight module based on the LED device is further provided. The optical film of the display module comprises a brightening film, an MOP film, and a QBEF film. As compared with the art known to the inventor in which several brightening films and DBEF films are adopted, in this embodiment, one MOP film is provided to replace at least one DBEF film and one brightening film. Moreover, through the LED devices which have wide-angle and uniform illumination, the OD/PITCH ratio of the backlight module can be reduced properly. Hence, in some embodiments, by using a simpler film configuration to correspond to the LED devices with uniform illumination, the backlight module can be prevented from having ununiform issue and can meet the required optical performances. As compared to the backlight module known to the inventor, in this embodiment, the number of the LED devices and the number of the films can be reduced, so that the backlight module can be thinner and have lower costs.

Embodiment (3)

In this embodiment, a display is provided. The display comprises the LED backlight module as mentioned in the embodiment (1) or the embodiment (2). The LED backlight module comprises an LED light plate, a diffusion plate, and an optical film, where the diffusion plate and the optical film are sequentially arranged on the LED light plate. The LED light plate comprises a driving circuit, a substrate, and a plurality of LED devices on the substrate. The LED device comprises a transparent LED frame, an LED chip disposed on a bottom portion of the transparent LED frame, and a packaging glue layer formed inside the transparent LED frame and covering the LED chip. A diffusion agent is distributed in the packaging glue layer. The optical film comprises a brightening film, a microlens-prism composite film (MOP), and a quantum dot optical film (QBEF) which are sequentially arranged from inside to outside of the optical film. The detail structure of the backlight module is already mentioned in the embodiment (1) or the embodiment (2) and is not iterated again. Because the LED device has a wider illumination angle and uniform illumination, the OD value can be reduced, and the PITCH value between the LED devices can be increased. Hence, the number of the LEDs can be reduced, thereby reducing the costs of the display. Moreover, in the backlight module, by using a simpler film configuration to correspond to the LED devices with uniform illumination, the backlight module can meet the required optical performances. Hence, the backlight module can be thinner and lighter while performing uniform illumination over the display units of the display.

It is understood that, in this embodiment, the backlight module is provided for backlight display applications (the backlight module may be the backlight module of a terminal device such as a TV, a display, and a mobile phone). Moreover, the backlight module may be, but not limited to be applied to the display backlight field. Upon applying the backlight module in the key backlight field, the backlight module can be provided as the key backlight sources for the mobile phone, the computer, or the keyboard.

What is claimed is:

1. An LED backlight module, comprising:
 a diffusion plate;
 a brightening film;
 a microlens-prism composite film (MOP);
 a quantum dot optical film (QBEF);
 a driving circuit;
 a substrate; and
 a plurality of LED devices on the substrate, each of the plurality of LED devices comprising a transparent LED frame, a light-emitting element disposed on a bottom portion of the transparent LED frame, and a resin layer formed inside the transparent LED frame and covering the light-emitting element;
 wherein the diffusion plate, the brightening film, the microlens-prism composite film (MOP), and the quantum dot optical film (QBEF) are sequentially arranged over the plurality of LED devices;
 wherein the plurality of LED devices is divided into a plurality of groups arranged in an N*N parallelogram array, and the LED devices of adjacent two rows in each of the groups arranged in the N*N parallelogram array are misaligned with each other.

2. The LED backlight module according to claim 1, wherein every four LED devices of the plurality of LED devices form a group arranged in a 2*2 parallelogram, the plurality of groups arranged in the 2*2 parallelogram is arranged in an array, and the LED devices of adjacent two rows in the array are misaligned with each other.

3. The LED backlight module according to claim 1, wherein each of the light-emitting devices comprises at least two lead electrodes, and a surface of the resin layer away from the lead electrodes of each of the light-emitting devices is a concave surface.

4. The LED backlight module according to claim 1, wherein the plurality of LED devices includes a light-blocking layer disposed on the resin layer, each of the light-emitting devices comprises a transparent molding, and an upper surface of the light-blocking layer is coplanar with an upper surface of the transparent molding and covers 60%-95% of an area of an upper surface of the resin layer.

5. The LED backlight module according to claim 1, wherein the adjacent two rows or two columns of the groups arranged in the 2*2 parallelogram are misaligned with each other.

6. The LED backlight module according to claim 5, wherein the resin layer includes a diffusion agent, and the amount of the diffusion agent over the resin layer is 1%-10% weight percentage.

7. The LED backlight module according to claim 1, wherein the LED frame includes a metal substrate and a wall, and a material of the wall is selected from transparent resin, transparent thermoplastic plastic material, PPA (polyphthalamide) or EMC (epoxy molding compound).

8. The LED backlight module according to claim 7, wherein the resin layer includes a fluorescent material to absorb a first light emitted by the light-emitting element and then emit a second light.

9. The LED backlight module according to claim 7, wherein a light emitted by the light-emitting element is transmitted through the wall of the LED frame.

\* \* \* \* \*